United States Patent
Sumida et al.

(10) Patent No.: US 11,890,841 B2
(45) Date of Patent: *Feb. 6, 2024

(54) LAMINATED BODY AND METHOD FOR PRODUCING LAMINATED BODY

(71) Applicant: SUMITOMO CHEMICAL COMPANY, LIMITED, Tokyo (JP)

(72) Inventors: Masakazu Sumida, Ehime (JP); Shota Konishi, Ehime (JP); Kensuke Maekawa, Osaka (JP); Noboru Kondo, Ehime (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 149 days.

This patent is subject to a terminal disclaimer.

(21) Appl. No.: 17/605,271

(22) PCT Filed: Mar. 13, 2020

(86) PCT No.: PCT/JP2020/011136
§ 371 (c)(1),
(2) Date: Oct. 21, 2021

(87) PCT Pub. No.: WO2020/217766
PCT Pub. Date: Oct. 29, 2020

(65) Prior Publication Data
US 2022/0227109 A1    Jul. 21, 2022

(30) Foreign Application Priority Data
Apr. 23, 2019  (JP) .................. 2019-082155

(51) Int. Cl.
*B32B 27/08*    (2006.01)
*B32B 27/30*    (2006.01)
(Continued)

(52) U.S. Cl.
CPC ............... *B32B 27/08* (2013.01); *B32B 7/02* (2013.01); *B32B 27/306* (2013.01);
(Continued)

(58) Field of Classification Search
CPC ........ B32B 7/02; B32B 27/308; B32B 27/306
See application file for complete search history.

(56) References Cited

U.S. PATENT DOCUMENTS

| | | |
|---|---|---|
| 2003/0108734 A1 | 6/2003 | Yano et al. |
| 2009/0226730 A1 | 9/2009 | Hoess et al. |

(Continued)

FOREIGN PATENT DOCUMENTS

| | | |
|---|---|---|
| JP | H04-339646 | 11/1992 |
| JP | 2003-201409 A | 7/2003 |

(Continued)

OTHER PUBLICATIONS

International Search Report and Written Opinion in PCT/JP2020/011136, dated Jun. 9, 2020. 8 pages.

*Primary Examiner* — Prashant J Khatri
(74) *Attorney, Agent, or Firm* — Meunier Carlin & Curfman LLC

(57) ABSTRACT

Provided are an acrylic resin layer laminate having excellent impact resistance and a manufacturing method of the same. The laminate includes a first acrylic resin layer, a thermoplastic resin layer, and a second acrylic resin layer in this order, in which the thermoplastic resin layer contains 71% or more of a component having a spin-spin relaxation time $T_2^H$ in pulse NMR measurement of 0.03 ms or longer. The manufacturing method of the laminate includes: discharging, from a die, a molten resin laminate containing at least a melt of a resin composition (1) containing a (meth)acrylic resin, a melt of a resin composition containing a thermoplastic resin, and a melt of a resin composition (2) contain- (Continued)

ing a (meth)acrylic resin; and cooling the discharged molten resin laminate to obtain a laminate.

5 Claims, 1 Drawing Sheet

(51) Int. Cl.
*B32B 27/40* (2006.01)
*B32B 7/02* (2019.01)
*B32B 27/36* (2006.01)
*B29C 45/16* (2006.01)
*B29K 23/00* (2006.01)
*B29K 33/00* (2006.01)
*B29K 69/00* (2006.01)
*B29K 75/00* (2006.01)
*B60J 1/00* (2006.01)

(52) U.S. Cl.
CPC .......... *B32B 27/308* (2013.01); *B32B 27/365* (2013.01); *B32B 27/40* (2013.01); *B29C 45/16* (2013.01); *B29K 2023/083* (2013.01); *B29K 2033/12* (2013.01); *B29K 2069/00* (2013.01); *B29K 2075/00* (2013.01); *B32B 2250/24* (2013.01); *B32B 2250/40* (2013.01); *B32B 2307/558* (2013.01); *B32B 2307/732* (2013.01); *B60J 1/00* (2013.01)

(56) References Cited

U.S. PATENT DOCUMENTS

| | | | |
|---|---|---|---|
| 2013/0344327 A1 | 12/2013 | Yoshida et al. | |
| 2015/0251391 A1* | 9/2015 | Tsujimoto | B32B 27/308 |
| | | | 428/501 |
| 2016/0101607 A1 | 4/2016 | Hoess et al. | |

FOREIGN PATENT DOCUMENTS

| | | |
|---|---|---|
| JP | 2009-541099 A | 11/2009 |
| JP | 5322929 | 11/2009 |
| JP | 6161795 | 6/2016 |
| JP | 2017-20032 | 1/2017 |
| JP | 2017-114029 A | 6/2017 |
| JP | 2019-42930 A | 3/2019 |

* cited by examiner

LAMINATED BODY AND METHOD FOR PRODUCING LAMINATED BODY

The present disclosure is the national phase under 35 U.S.C 371 of PCT/JP2020/011136 filed on Mar. 13, 2020, which claims priority to Japanese Patent Application No. 2019-082155, filed with the Japanese Patent Office on Apr. 23, 2019 both of which are incorporated herein by reference in their entireties.

TECHNICAL FIELD

The present invention relates to a laminate, and more particularly, to a transparent resin laminate and a manufacturing method of the same.

BACKGROUND ART

A vehicle such as an automobile or a railway vehicle has a glass window material. On the other hand, in particular, in a vehicle or the like, weight reduction is strongly required to improve fuel consumption. Therefore, attempts have been made to develop a vehicle window material using a resin having a specific gravity smaller than that of glass as a base material.

For example, in a vehicle window material, it is important to provide physical strength such as impact resistance while maintaining transparency in an actual use environment. However, in general, when a resin having high transparency is used for a resin window material, there is a technical problem in that performance such as impact resistance tends to be insufficient as compared to a glass window material.

For example, JP-A-2003-201409 (Patent Document 1) describes a resin composition obtained by dispersing an oxide compound (B) which has a hydroxyl group on a surface thereof and is partially hydrophobized in a copolymer (A) of an unsaturated monomer (a) having a functional group capable of hydrogen bonding with a hydroxyl group and another monomer (b) copolymerizable with the unsaturated monomer (a) (claim 1). Here, an unsaturated monomer having a functional group capable of hydrogen bonding with a silanol group is described as the unsaturated monomer (a), a silica compound which has a silanol group on a surface thereof and is partially hydrophobized is described as the oxide compound (B), and a methacrylic monomer and/or an acrylic monomer is described as the another monomer (b) (claims 2 and 3). Further, it is described that improvement in impact resistance and rigidity can be realized by the above resin composition without affecting transparency or impact strength (for example, paragraph [0015] or the like).

PRIOR ART DOCUMENT

Patent Document

Patent Document 1: JP-A-2003-201409

SUMMARY OF THE INVENTION

Problems to be Solved by the Invention

In the invention of Patent Document 1, the impact resistance and the rigidity are improved by blending the oxide compound (B) such as a silica compound. However, since physical performance such as impact resistance required in, for example, a plastic base material for an automobile glazing is significantly high, means for improving impact resistance is also required.

The present invention is intended to solve the problems of the related art, and an object of the present invention is to provide an acrylic resin layer laminate having excellent impact resistance.

Means for Solving the Problems

In order to solve the problems, the present invention provides the following aspects.

[1]
A laminate including a first acrylic resin layer, a thermoplastic resin layer, and a second acrylic resin layer in this order,
in which the thermoplastic resin layer contains 71% or more of a component having a spin-spin relaxation time $T_2^H$ in pulse NMR measurement of 0.03 ms or longer.

[2]
The laminate, in which a thickness of the first acrylic resin layer is 0.1 mm or more and 1.0 mm or less,
a thickness of the thermoplastic resin layer is 0.05 mm or more and 2.5 mm or less, and a thickness of the second acrylic resin layer is 0.1 mm or more and 30 mm or less.

[3]
The laminate further including a third acrylic resin layer, in which
the third acrylic resin layer is provided between the second acrylic resin layer and the thermoplastic resin layer.

[4]
The laminate, in which a ratio $[T_1:T_2]$ of a thickness $T_1$ of the first acrylic resin layer to a thickness $T_2$ of the second acrylic resin layer is within a range of $T_1:T_2=1:1.9$ to $1:29$.

[5]
The laminate, in which a ratio $[T_1:(T_2+T_3)]$ of a thickness $T_1$ of the first acrylic resin layer to the sum of a thickness $T_2$ of the second acrylic resin layer and a thickness $T_3$ of the third acrylic resin layer is within a range of $T_1:(T_2+T_3)=1:2$ to $1:30$.

[6]
The laminate, in which a thermoplastic resin constituting the thermoplastic resin layer is one or more selected from the group consisting of a polyurethane resin, a polyvinyl acetal resin, an ethylene-methacrylic acid ester copolymer resin, and an ethylene-vinyl acetate copolymer resin.

[7]
A manufacturing method of a laminate including a first acrylic resin layer, a thermoplastic resin layer, a third acrylic resin layer, and a second acrylic resin layer in this order, the method including:
disposing a laminate for an injection molding including the first acrylic resin layer, the thermoplastic resin layer, and the third acrylic resin layer in this order in a mold; and
molding a second acrylic resin layer by injecting a resin composition (2) containing a (meth)acrylic resin on the third acrylic resin layer of the laminate for an injection molding disposed in the mold,
in which the thermoplastic resin layer contains 71% or more of a component having a spin-spin relaxation time $T_2^H$ in pulse NMR measurement of 0.03 ms or longer.

[8]
A manufacturing method of a laminate including a first acrylic resin layer formed of a resin composition (1) containing a (meth)acrylic resin, a thermoplastic resin layer formed of a resin composition containing a thermoplastic resin, and a second acrylic resin layer formed of a resin composition (2) containing a (meth)acrylic resin in this order, the method including:

discharging, from a die, a molten resin laminate containing at least a melt of the resin composition (1) containing the (meth)acrylic resin, a melt of the resin composition containing the thermoplastic resin, and a melt of the resin composition (2) containing the (meth)acrylic resin; and cooling the discharged molten resin laminate to obtain a laminate, in which the thermoplastic resin layer contains 71% or more of a component having a spin-spin relaxation time $T_2^H$ in pulse NMR measurement of 0.03 ms or longer.

Effect of the Invention

The resin laminate has an advantage that impact resistance, in particular, impact resistance under a low-temperature condition is excellent. The resin laminate has an advantage that it can be appropriately used as, for example, a resin glazing material.

MODE FOR CARRYING OUT THE INVENTION

Figure 1:
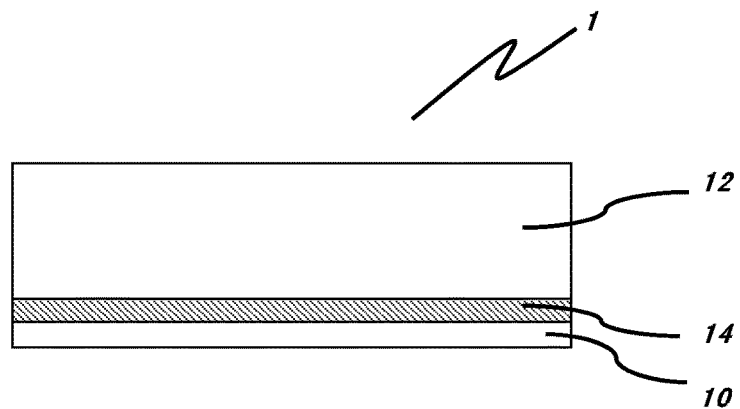
FIG. 1 is a schematic explanatory view of a laminate including a first acrylic resin layer, a thermoplastic resin layer, and a second acrylic resin layer.

First, a background leading to the present invention will be described. In the present invention, experiments and studies were conducted for the purpose of using an acrylic resin having excellent transparency, relatively high hardness, and excellent weather resistance, for example, as a resin glazing material. The acrylic resin has excellent transparency, hardness, weather resistance, and the like. On the other hand, the acrylic resin has a technical problem in that it tends to be easily broken as compared with, for example, a tough resin.

The present inventors have conducted intensive studies to solve the technical problem. As a result, the present inventors found through experiments that the technical problem can be solved by using a specific thermoplastic resin together with an acrylic resin, thereby completing the present invention.

The laminate includes a first acrylic resin layer, a thermoplastic resin layer, and a second acrylic resin layer in this order. The thermoplastic resin layer contains 71% or more of a component having a spin-spin relaxation time $T_2^H$ in pulse NMR measurement of 0.03 ms or longer. Hereinafter, the respective resin layers will be described.

First Acrylic Resin Layer

The first acrylic resin layer is a resin layer containing a (meth)acrylic resin. Examples of the (meth)acrylic resin can include a homopolymer of a (meth)acrylic monomer such as (meth)acrylic acid ester, a copolymer of two or more (meth)acrylic monomers, and a copolymer of a (meth)acrylic monomer and a monomer other than the (meth)acrylic monomer. In the present specification, the term "(meth)acryl" means "acryl" or "methacryl".

The (meth)acrylic resin is preferably a methacrylic resin from the viewpoint of easily enhancing hardness, weather resistance, and transparency of the resin laminate. In the present specification, the methacrylic resin is a polymer having a structural unit derived from a monomer having a methacrylic group.

Examples of the methacrylic resin can include a methacrylic homopolymer having only a structural unit derived from alkyl methacrylate having an alkyl group having 1 to 4 carbon atoms, and a methacrylic copolymer having 80% by mass or more and less than 100% by mass of a structural unit derived from alkyl methacrylate having an alkyl group having 1 to 4 carbon atoms and having more than 0% by mass and 20% by mass or less of a structural unit derived from another vinyl monomer copolymerizable with a structural unit derived from methacrylic acid ester having an alkyl group having 1 to 4 carbon atoms.

The "alkyl methacrylate having an alkyl group having 1 to 4 carbon atoms" is a compound represented by $CH_2=CH(CH_3)COOR$ (R is an alkyl group having 1 to 4 carbon atoms).

The vinyl monomer copolymerizable with methacrylic acid ester having an alkyl group having 1 to 4 carbon atoms is copolymerizable with methacrylic acid ester having an alkyl group having 1 to 4 carbon atoms, and is a monomer having a vinyl group.

Specific examples of the alkyl methacrylate having an alkyl group having 1 to 4 carbon atoms can include methyl methacrylate, ethyl methacrylate, n-propyl methacrylate, isopropyl methacrylate, n-butyl methacrylate, tert-butyl methacrylate, sec-butyl methacrylate, and isobutyl methacrylate. Among them, methyl methacrylate is particularly preferred. The alkyl methacrylates may be used alone or as a mixture of two or more thereof.

Examples of the vinyl monomer copolymerizable with methacrylic acid ester having an alkyl group having 1 to 4 carbon atoms can include methacrylic acid ester (excluding alkyl methacrylate having an alkyl group having 1 to 4 carbon atoms) such as cyclohexyl methacrylate, benzyl methacrylate, 2-ethylhexyl methacrylate, 2-hydroxyethyl methacrylate, hydroxypropyl methacrylate, or monoglycerol methacrylate; acrylic acid ester such as methyl acrylate, ethyl acrylate, propyl acrylate, butyl acrylate, 2-ethylhexyl acrylate, 2-hydroxyethyl acrylate, 2-hydroxypropyl acrylate, or monoglycerol acrylate; unsaturated carboxylic acid or an acid anhydride thereof such as acrylic acid, methacrylic acid, maleic acid, itaconic acid, maleic anhydride, or itaconic anhydride; a nitrogen-containing monomer such as acrylamide, methacrylamide, acrylonitrile, methacrylonitrile, diacetone acrylamide, or dimethylaminoethyl methacrylate; an epoxy group-containing monomer such as allyl glycidyl ether, glycidyl acrylate, or glycidyl methacrylate; and a styrene-based monomer such as styrene or α-methylstyrene.

Among them, cyclohexyl methacrylate, methyl acrylate, ethyl acrylate, acrylic acid, methacrylic acid, maleic anhydride, or styrene is preferred, and cyclohexyl methacrylate, methyl acrylate, ethyl acrylate, acrylic acid, or styrene is more preferred.

As the methacrylic resin, a methacrylic homopolymer having only a structural unit derived from methyl methacrylate, or a methacrylic copolymer having 80% by mass or more and less than 100% by mass of a structural unit derived from methyl methacrylate and more than 0% by mass and 20% by mass or less of a structural unit derived from another vinyl monomer copolymerizable with a structural unit derived from methyl methacrylate is preferred from the viewpoint of easily enhancing weather resistance and transparency of the resin laminate.

An example of a method of producing the methacrylic resin can include a method of polymerizing methacrylic acid ester having an alkyl group having 1 to 4 carbon atoms, and if necessary, a vinyl monomer copolymerizable with methacrylic acid ester having an alkyl group having 1 to 4 carbon atoms, by a method such as bulk polymerization, solution polymerization, suspension polymerization, or emulsion polymerization.

A melt mass flow rate (hereinafter, may be referred to as an MFR) of the (meth)acrylic resin contained in the first acrylic resin layer when measured at a load of 3.80 kg and 230° C. is preferably 0.1 to 20 g/10 min, more preferably 0.2 to 10 g/10 min, and still more preferably 0.5 to 5 g/10 min. When the MFR is equal to or less than the above upper limit, there are advantages that strength of the obtained resin layer is excellent and the resin layer is easily formed. The MFR can be measured in accordance with a method specified in JIS K 7210:2014 "Test Methods for Melt Mass Flow Rate (MFR) and Melt Volume Flow Rate (MVR) of Plastic-Thermoplastic". An MFR of a poly(methyl methacrylate)-based material is measured at a temperature of 230° C. and a load of 3.80 kg (37.3 N) and is specified by the above JIS.

A weight average molecular weight (hereinafter, may be referred to as an Mw) of the (meth)acrylic resin contained in the first acrylic resin layer is preferably 50,000 to 300,000. When the Mw is within the above range, there is an advantage that excellent transparency, weather resistance, mechanical strength, and the like can be obtained. The Mw is preferably 70,000 or more and more preferably 100,000 or more. In addition, the Mw is preferably 250,000 or less and more preferably 200,000 or less. The weight average molecular weight is measured by gel permeation chromatography (GPC) measurement.

The first acrylic resin layer may further contain another resin different from the (meth)acrylic resin, if necessary. In a case where another resin is contained, the type thereof is not particularly limited as long as the transparency of the resin laminate is not significantly impaired. The amount of another resin is preferably 20% by mass or less, more preferably 10% by mass or less, and still more preferably 5% by mass or less, based on the total resin contained in the first acrylic resin layer, from the viewpoint of hardness and weather resistance of the resin laminate. Examples of the another resin can include a polycarbonate resin, a polyamide resin, an acrylonitrile-styrene copolymer, a methyl methacrylate-styrene copolymer, and polyethylene terephthalate. The first acrylic resin layer may further contain another resin, but from the viewpoint of transparency or the like, the amount of another resin is preferably 20% by mass or less, and the resin contained in the first acrylic resin layer is more preferably only a (meth)acrylic resin.

The first acrylic resin layer may also further contain various generally used additives as long as the effect of the present invention is not impaired. Examples of the additive can include crosslinked rubber particles, an ultraviolet absorber, a slipping agent, an antioxidant, a mold release agent, and an antistatic agent.

Examples of the crosslinked rubber particle can include a multilayer rubber particle which has at least a core part and a coating layer covering the core part, in which at least one of the core part and the coating layer is formed of a material having a structural unit derived from a polyfunctional monomer having two or more carbon-carbon unsaturated bonds.

Examples of the ultraviolet absorber can include a benzophenone-based ultraviolet absorber, a cyanoacrylate-based ultraviolet absorber, a benzotriazole-based ultraviolet absorber, a malonic acid ester-based ultraviolet absorber, and an oxalanilide-based ultraviolet absorber.

Examples of the slipping agent can include silicone oil and a polysiloxane-based compound. Examples of the antioxidant can include a phenol-based antioxidant, a sulfur-based antioxidant, and a phosphorus-based antioxidant. Examples of the mold release agent can include a higher fatty acid ester, a higher aliphatic alcohol, a higher fatty acid, a higher fatty acid amide, a higher fatty acid metal salt, and a fatty acid derivative. Examples of the antistatic agent can include a conductive inorganic particle, a tertiary amine, a quaternary ammonium salt, a cationic acrylic acid ester derivative, and a cationic vinyl ether derivative.

A thickness of the first acrylic resin layer is preferably 0.1 mm or more and 1.0 mm or less, more preferably 0.2 mm or more and 0.8 mm or less, and still more preferably 0.2 mm or more and 0.5 mm or less. When the thickness of the first acrylic resin layer is within the above range, there are advantages that the thermoplastic resin layer constituting the laminate can be preferably retained and strength of the laminate can be maintained.

Second Acrylic Resin Layer

The second acrylic resin layer is a resin layer containing a (meth)acrylic resin. The second acrylic resin layer may have the same composition as or a different composition from that of the first acrylic resin layer. It is preferable that the second acrylic resin layer has the same composition as that of the first acrylic resin layer.

A thickness of the second acrylic resin layer can be appropriately selected depending on the use of the laminate. The thickness of the second acrylic resin layer is preferably 0.1 mm or more and 30 mm or less. When the thickness of the second acrylic resin layer is within the above range, there is an advantage that physical strength of the laminate can be designed in a preferred range depending on the use of the laminate. For example, in a case where the laminate is used as a resin glazing material, the thickness of the second acrylic resin layer is preferably 0.5 mm or more and 10 mm or less and more preferably 1.0 mm or more and 8 mm or less.

In addition, a ratio [T1:T2] of a thickness T1 of the first acrylic resin layer to a thickness T2 of the second acrylic resin layer is within a range of T1:T2=1:1.9 to 1:29. When the ratio [T1:T2] is within the above range, there is an advantage that impact resistance and physical strength of the entire laminate are in more preferred ranges. For example, in a case where the laminate is used as a glazing for an automobile or building material, there is an advantage that the laminate can withstand a stronger impact by installing the second acrylic resin layer on the outdoor side.

Third Acrylic Resin Layer

The laminate may include a third acrylic resin layer, if necessary. In a case where the laminate includes the third acrylic resin layer, the third acrylic resin layer is a layer provided between the second acrylic resin layer and a thermoplastic resin layer described in detail below.

The third acrylic resin layer is a resin layer containing a (meth)acrylic resin. The third acrylic resin layer may have the same composition as or a different composition from that of the first acrylic resin layer.

The third acrylic resin layer may be formed of a methacrylic copolymer having, for example, 50% by mass or more and less than 100% by mass of a structural unit derived from alkyl methacrylate having an alkyl group having 1 to 4 carbon atoms, and more than 0% by mass and 50% by mass or less of a structural unit derived from another vinyl monomer copolymerizable with a structural unit derived from methacrylic acid ester having an alkyl group having 1 to 4 carbon atoms as long as transparency and weather resistance are not impaired.

The third acrylic resin layer may further contain another resin different from the (meth)acrylic resin, if necessary. In a case where another resin is contained, the type thereof is not particularly limited as long as the transparency of the resin laminate is not significantly impaired. The amount of another resin is preferably 40% by mass or less, more preferably 10% by mass or less, and still more preferably 5% by mass or less, based on the total resin contained in the third acrylic resin layer, from the viewpoint of transparency and weather resistance of the resin laminate. Examples of the another resin can include a polycarbonate resin, a polyamide resin, an acrylonitrile-styrene copolymer, a methyl methacrylate-styrene copolymer, and polyethylene terephthalate. The third acrylic resin layer may further contain another resin, but from the viewpoint of transparency or the like, the amount of another resin is preferably 40% by mass or less, and the resin contained in the third acrylic resin layer is more preferably only a (meth)acrylic resin.

The third acrylic resin layer can be formed, for example, according to a manufacturing method of a laminate. For example, when the laminate is manufactured by extrusion molding in which a melt of the resin composition is discharged from a die, the third acrylic resin layer may not be provided. In addition, for example, in the manufacturing of the laminate, first, in a case where a laminate is manufactured by manufacturing a laminate for an injection molding including a first acrylic resin layer, a thermoplastic resin layer, and a third acrylic resin layer in this order, disposing the obtained laminate for an injection molding in a mold, and molding a second acrylic resin layer by injecting a resin composition (2) containing a (meth)acrylic resin on the third acrylic resin layer of the laminate for an injection molding disposed in the mold, the obtained laminate contains a third acrylic resin. In this case, in a case where the second acrylic resin layer and the third acrylic resin layer have substantially the same compositions, a clear compositional boundary between these resin layers is not present in the obtained laminate.

In a case where the laminate includes the third acrylic resin layer, a thickness of the third acrylic resin layer is preferably 0.01 mm or more and 1.0 mm or less. The thickness is more preferably 0.03 mm or more and 0.5 mm or less and still more preferably 0.05 mm or more and 0.4 mm or less. When the thickness of the third acrylic resin layer is within the above range, there is an advantage that the thermoplastic resin layer of the laminate for an injection molding can be preferably retained during, for example, injection molding.

In addition, in a case where the laminate includes the third acrylic resin layer, a ratio $[T_1:(T_2+T_3)]$ of a thickness $T_1$ of the first acrylic resin layer to the sum of a thickness $T_2$ of the second acrylic resin layer and a thickness $T_3$ of the third acrylic resin layer is within a range of $T_1:(T_2+T_3)=1:2$ to 1:30. When the ratio $[T_1:(T_2+T_3)]$ is within the above range, there is an advantage that impact resistance and physical strength of the entire laminate are in more preferred ranges. For example, in a case where the laminate is used as a glazing for an automobile or building material, there is an advantage that the laminate can withstand a stronger impact by installing the second acrylic resin layer on the outdoor side.

Thermoplastic Resin Layer

The thermoplastic resin layer is a layer provided between the first acrylic resin layer and the second acrylic resin layer. The thermoplastic resin layer contains 71% or more of a component having a spin-spin relaxation time $T_2^H$ in pulse NMR measurement of 0.03 ms or longer. In the laminate, when the thermoplastic resin layer contains 71% or more of a component having a spin-spin relaxation time of proton nucleus $T_2^H$ in pulse NMR measurement of 0.03 ms or longer, impact resistance, in particular, impact resistance at a low temperature is excellent.

Preferably, when the thermoplastic resin layer contains 71% or more of a component having a spin-spin relaxation time $T_2^H$ of 0.03 ms or longer and 1.0 ms or shorter, impact resistance, in particular, impact resistance at a low temperature is excellent.

The thermoplastic resin layer preferably contains 99% or less and more preferably 95% or less of a component having a spin-spin relaxation time $T_2^H$ in pulse NMR measurement of 0.03 ms or longer, from the viewpoint of molding processing of the resin laminate.

The spin-spin relaxation time $T_2^H$ in pulse NMR measurement means a time required to decrease a magnetic resonance signal immediately after a longitudinal magnetization vector is tilted in a direction perpendicular to a static magnetic field to 1/e. When the spin-spin relaxation time $T_2^H$ is long, the composition can be referred to as an amorphous phase that is a component having high motility. In addition, when the spin-spin relaxation time $T_2^H$ is short, the component can be referred to as a crystal phase that is a component having low motility, and an intermediate component can be referred to as an interface phase.

In the present specification, the "component having a spin-spin relaxation time $T_2^H$ in pulse NMR measurement of 0.03 ms or longer" means, among the components described above, a component having a long spin-spin relaxation time $T_2^H$ and a component having an intermediate spin-spin relaxation time $T_2^H$.

The spin-spin relaxation time $T_2^H$ in the thermoplastic resin layer is calculated as a relaxation time T2 and a component fraction R of hydrogen 1 from attenuation of a signal intensity I(τ) obtained by changing a value of a waiting time τ in a pulse sequence in the Solid Echo method using a pulse NMR apparatus.

The attenuation of the signal intensity I(τ) by the Solid Echo method is acquired by the method described in J. G. Powles, J. H. Strange, Proc. Phys. Soc., 82, 6-15 (1963).

The obtained signal intensity I(τ) is expressed as $I_N(τ)$ which is a value normalized by a signal intensity $I(τ_0)$ when a time τ is τ=0. $I_N(τ)$ is plotted against the time τ, and $T_2^H$ and R are calculated from fitting using a calculation curve $I_F(τ)$ calculated by Equation (F1), in which units of $T_2^H$ and R are a millisecond and a component fraction, respectively.

[Math. 1]

$$I_F(\tau) = \sum_{n=1}^{4} \left( R_n \times \exp\left[ -\left(\frac{1}{a_n}\right) \times \left(\frac{\tau}{T_{2n}^H}\right)^{a_n} \right] \right) \quad (F1)$$

[Wherein, $R_n$ represents a component fraction calculated by fitting so that the sum of the terms in Equation (F1) has the same value as the normalized signal intensity $I_N(\tau)$ acquired by measurement, and $T_{2n}^H$ and $a_n$ represent a relaxation time and a shape factor calculated by fitting, respectively.]

In the fitting, each of Rn, $T_{2n}^H$, and an is a value at which a root mean square s represented by Equation (F2) is less than 0.01.

[Math. 2]

$$s = \sqrt{\frac{1}{k}\sum_{\tau=0}^{\tau_D}(I_N(\tau) - I_F(\tau))^2} \quad (F2)$$

[Wherein, $\tau_D$ represents a time during which $I_N(\tau)$ sufficiently attenuates and is a value when $I_N(\tau)/I_N(\tau_D)$ is less than 0.01, and k represents the number of data points of the signal intensity $I_N(\tau)$ acquired when the time $\tau$ is between $\tau_0$ to $\tau_D$.]

In the pulse NMR measurement, a form of a measurement sample of the thermoplastic resin layer may be a powder sample or a molded sample.

An example of the pulse NMR apparatus can include a 20 MHz pulse NMR apparatus (manufactured by Bruker Corporation).

The thermoplastic resin layer contains various resins provided that it contains 71% or more of a component having a spin-spin relaxation time $T_2^H$ in pulse NMR measurement of 0.03 ms or longer. Examples of the resin contained in the thermoplastic resin layer can include a polyurethane resin, a polyvinyl acetal resin, an ethylene-methacrylic acid ester copolymer resin, and an ethylene-vinyl acetate copolymer resin.

Examples of the polyurethane resin that can be used as the thermoplastic resin can be produced, for example, by reacting a polyisocyanate, a polyol, and a chain extender with each other.

Specific examples of the polyisocyanate can include diphenylmethane diisocyanate, hexamethylene diisocyanate, tolylene 2,4-diisocyanate, tolylene 2,6-diisocyanate, or a mixture thereof, 1,5-naphthalene diisocyanate, isophorone diisocyanate, xylylene diisocyanate, cyclohexane-1,4-diisocyanate, dicyclohexylmethane 2,2'-diisocyanate, dicyclohexylmethane 2,4'-diisocyanate, dicyclohexylmethane 4,4'-diisocyanate, or a mixture thereof, and 1-methylcyclohexane 2,4-diisocyanate, 1-methylcyclohexane-2,6-diisocyanate, or a mixture thereof. Among the polyisocyanates, diphenylmethane diisocyanate, hexamethylene diisocyanate, dicyclohexylmethane diisocyanate, and the like are more preferably used.

Examples of the polyol can include a polyester polyol, a polyether polyol, and a lactone-based polyol.

The polyester polyol is obtained by a polycondensation reaction of a dicarboxylic acid and a diol. Specific examples of the diol can include ethanediol, 1,3-propanediol, 1,4-butanediol, 1,5-pentanediol, and 1,6-hexanediol. These diols may be used alone or in combination of two or more thereof. Examples of the dicarboxylic acid can include succinic acid, maleic acid, glutaric acid, adipic acid, sebacic acid, phthalic acid, isophthalic acid, and terephthalic acid. These dicarboxylic acids may be used alone or in combination of two or more thereof.

The polyether polyol can be prepared, for example, by ring-opening polymerization of alkylene oxide. Specific examples of the polyether polyol can include polyethylene ether glycol, polypropylene ether glycol, and polytetramethylene ether glycol. These polyether polyols may be used alone or in combination of two or more thereof. Among them, polytetramethylene ether glycol is preferred. A number average molecular weight thereof is 500 to 10,000 and preferably 1,000 to 4,000.

The lactone-based polyol can be prepared, for example, by ring-opening polymerization of a lactone monomer (for example, δ-valerolactone, β-methyl-δ-valerolactone, ε-caprolactone, α-methyl-ε-caprolactone, β-methyl-ε-caprolactone, γ-methyl-ε-caprolactone, β,δ-dimethyl-ε-caprolactone, 3,3,5-trimethyl-ε-caprolactone, enantholactone, dodecanolactone, or the like) using the diol and/or the glycol as an initiator.

Examples of the chain extender can include an aliphatic linear diol having 2 to 6 carbon atoms such as ethanediol, 1,4-butanediol, or 1,6-hexanediol, and 1,4-bis(hydroxyethoxy)benzene. Amines such as hexamethylenediamine, isophoronediamine, tolylenediamine, and monoethanolamine can also be partially used in combination. Among them, an aliphatic linear diol having 2 to 6 carbon atoms is preferred.

A specific example of the polyurethane resin that can be used as the thermoplastic resin can include a block copolymer formed of a soft segment formed by a reaction of a polyol and a polyisocyanate and a hard segment formed by a reaction of a chain extender and a polyisocyanate. Here, a component having a spin-spin relaxation time $T_2^H$ in pulse NMR measurement of shorter than 0.03 ms corresponds to the hard segment that is a crystal phase component having low mobility. In addition, a component having a spin-spin relaxation time $T_2^H$ in pulse NMR measurement of 0.03 ms or longer corresponds to the soft segment. In the polyurethane resin, a ratio of the hard segment to the soft segment can be adjusted by adjusting a ratio between the polyisocyanate, the polyol, and the chain extender used for preparation, a size of a phase separation structure or a crystal structure, and the like.

As the polyurethane resin that can be used as the thermoplastic resin, a commercially available product may be used. Examples of the commercially available products can include PANDEX T-1185N, T-8185N, T-1180N, T-8180N, and T-8175N manufactured by DIC Covestro Polymer Ltd. and Elastollan 1180A and NY80A manufactured by BASF SE.

The ethylene-vinyl acetate copolymer that can be used as the thermoplastic resin is a copolymer resin having a monomer unit based on ethylene and a monomer unit based on vinyl acetate. The ethylene-vinyl acetate copolymer resin can be produced, for example, by subjecting ethylene and vinyl acetate to a radical polymerization reaction using a radical polymerization initiator.

In the ethylene-vinyl acetate copolymer resin, for example, a content of the vinyl acetate that is a content of the monomer unit based on vinyl acetate contained in an ethylene-vinyl acetate copolymer is preferably 20 to 40% by mass and more preferably 25 to 35% by mass. The content of the vinyl acetate in the ethylene-vinyl acetate copolymer resin is a value when the mass of the ethylene-vinyl acetate copolymer resin is 100% by mass.

When the content of the vinyl acetate is within the above range, the ethylene-vinyl acetate copolymer resin to be obtained can be preferably designed so that a component having a spin-spin relaxation time $T_2^H$ in pulse NMR measurement of 0.03 ms or longer is contained in an amount of 71% or more. When the content of the vinyl acetate is within the above range, excellent transparency and flexibility can be secured.

As the ethylene-vinyl acetate copolymer resin, a commercially available product may be used. Examples of the commercially available product can include SUMITATE KA-30 and KA-40 manufactured by Sumitomo Chemical Co., Ltd.

Examples of the ethylene-methacrylic acid ester copolymer resin that can be used as the thermoplastic resin can include a copolymer of ethylene and one or two or more monomers selected from methyl methacrylate, ethyl methacrylate, propyl methacrylate, butyl methacrylate, 2-ethylhexyl methacrylate, hydroxyethyl methacrylate, and hydroxypropyl methacrylate. Among the above monomers, methyl methacrylate is particularly preferably used.

The ethylene-methacrylic acid ester copolymer resin can be adjusted by adjusting a content of the methacrylic acid ester so that a percentage of a component having a spin-spin relaxation time $T_2^H$ in pulse NMR measurement of 0.03 ms or longer in the ethylene-methacrylic acid ester copolymer resin to be obtained is 71% or more. The content of the methacrylic acid ester is preferably 15% by mass or more and 40% by mass or less and more preferably 18% by mass or more and 30% by mass or less. When the amount of methacrylic acid ester is 15% by mass or more, excellent transparency and excellent adhesion to the first acrylic resin layer, the second acrylic resin layer, and the like can be obtained. In addition, when the amount of methacrylic acid ester is 40% by mass or less, excellent impact resistance can be obtained.

As the ethylene-methacrylic acid ester copolymer resin, a commercially available product may be used. Examples of the commercially available product can include ACRYFT WK307, WK402, and WH206-F manufactured by Sumitomo Chemical Co., Ltd.

Examples of the polyvinyl acetal resin that can be used as the thermoplastic resin can include a resin obtained by acetalizing some or all of the hydroxyl groups of polyvinyl alcohol.

An example of a method of producing the polyvinyl acetal resin can include a method in which polyvinyl alcohol is dissolved in warm water, the obtained polyvinyl alcohol aqueous solution is maintained at 0 to 90° C., and preferably 10 to 20° C., an acid catalyst and aldehyde are added to allow an acetalization reaction to proceed while performing stirring, a reaction temperature is raised to 70° C. for aging to complete the reaction, and then neutralization, water washing, and drying are performed to obtain a powder of a polyvinyl acetal resin.

The aldehyde is not particularly limited, but examples thereof can include aliphatic, aromatic, and alicyclic aldehydes such as propionaldehyde, n-butyraldehyde, isobutyraldehyde, valeraldehyde, n-hexylaldehyde, 2-ethylbutyraldehyde, n-heptylaldehyde, n-octylaldehyde, n-nonylaldehyde, n-decylaldehyde, benzaldehyde, and cinnamaldehyde. Preferably, n-butyraldehyde, n-hexylaldehyde, 2-ethylbutyraldehyde, or n-octylaldehyde having 4 to 8 carbon atoms is used. When n-butyraldehyde having 4 carbon atoms is used for a polyvinyl acetal resin to be obtained, whether resistance is excellent and a resin is easily produced, which is preferable. These polyvinyl acetal resins may be used alone or in combination of two or more thereof. The polyvinyl acetal resin may not be crosslinked or may be crosslinked.

As the polyvinyl acetal resin, a polyvinyl acetal resin having a degree of acetalization of 60 to 85 mol % can be preferably used. The degree of acetalization is more preferably 65 to 80 mol %. When the degree of acetalization is within the above range, a percentage of a component having a spin-spin relaxation time $T_2^H$ in pulse NMR measurement of 0.03 ms or longer in the polyvinyl acetal resin to be obtained can be preferably adjusted to 71% or more.

Among the thermoplastic resins, a polyurethane resin, an ethylene-vinyl acetate copolymer resin, an ethylene-methacrylic acid ester copolymer resin, and the like are preferably used, and a polyurethane resin is particularly preferably used.

One thermoplastic resin may be used alone, or two or more thermoplastic resins may be used in combination, provided that a component having a spin-spin relaxation time $T_2^H$ in pulse NMR measurement of 0.03 ms or longer is contained in an amount of 71% or more.

A thickness of the thermoplastic resin layer is preferably 0.05 mm or more and 2.5 mm or less, more preferably 0.1 mm or more and 2.0 mm or less, and still more preferably 0.2 mm or more and 1.8 mm or less. When the thickness of the thermoplastic resin layer is within the above range, impact resistance of the laminate can be significantly improved, and an antiscattering performance can be improved.

Manufacturing Method of Laminate

An example of one aspect of a manufacturing method of a laminate can include a manufacturing method of a laminate in which a laminate for an injection molding including a first acrylic resin layer, a thermoplastic resin layer, and a third acrylic resin layer in this order is manufactured in advance, the laminate for an injection molding is disposed in a mold, and a second acrylic resin layer is molded by injecting a resin composition (2) containing a (meth)acrylic resin on the third acrylic resin layer of the laminate for an injection molding disposed in the mold. When the laminate is manufactured, the obtained laminate contains a third acrylic resin. In this case, in a case where the second acrylic resin layer and the third acrylic resin layer have substantially the same compositions, a clear compositional boundary between these resin layers is not present in the obtained laminate.

The laminate for an injection molding including a first acrylic resin layer, a thermoplastic resin layer, and a third acrylic resin layer in this order can be manufactured using a known molding machine (for example, an extrusion molding machine, a calendar roll molding machine, a press molding machine, an injection molding machine, a transfer molding machine, or the like) under conditions usually used by those skilled in the art. A thickness of the laminate for an injection molding is preferably in a range of 0.1 to 3.0 mm and more preferably in a range of 0.3 to 2.5 mm. When the thickness of the laminate for an injection molding is within the above range, excellent injection molding processability can be obtained.

In the laminate for an injection molding, a thickness of the first acrylic resin layer is preferably 0.1 mm or more and 1.0 mm or less, more preferably 0.2 mm or more and 0.8 mm or less, and still more preferably 0.2 mm or more and 0.5 mm or less. A thickness of the thermoplastic resin layer is preferably 0.05 mm or more and 2.5 mm or less, more preferably 0.1 mm or more and 2.0 mm or less, and still more preferably 0.2 mm or more and 1.8 mm or less. A thickness of the third acrylic resin layer is preferably 0.01 mm or more and 1.0 mm or less, more preferably 0.03 mm or more and 0.5 mm or less, and still more preferably 0.05 mm or more and 0.4 mm or less.

Next, the laminate for an injection molding is disposed in a mold. When the laminate for an injection molding is disposed in the mold, the laminate for an injection molding may be temporarily fixed in the mold. By performing the temporary fixing, the injection molding of the resin composition (2) containing the (meth)acrylic resin can be preferably performed.

Then, a second acrylic resin layer is molded by injecting the resin composition (2) containing the (meth)acrylic resin on the third acrylic resin layer of the laminate for an injection molding disposed in the mold. The resin composition (2) is a resin composition for molding a second acrylic resin layer, and is a resin composition containing the (meth)acrylic resin contained in the second acrylic resin layer.

As the injection molding method, in addition to a normal injection molding method, an ultrahigh-speed injection molding method, an injection compression molding method, a gas-assisted injection molding method, and the like can be used. The injection molding conditions can be appropriately selected depending on each of the injection molding methods. For example, the second acrylic resin layer can be molded by melting the resin composition (2) containing the (meth)acrylic resin and injecting the resin composition (2) into a mold under conditions of a cylinder temperature of 200 to 280° C. and a mold temperature of 35 to 85° C.

A thickness of the second acrylic resin layer molded as described above is preferably 0.1 mm or more and 30 mm or less and more preferably 0.5 mm or more and 10 mm or less.

Figure 2:
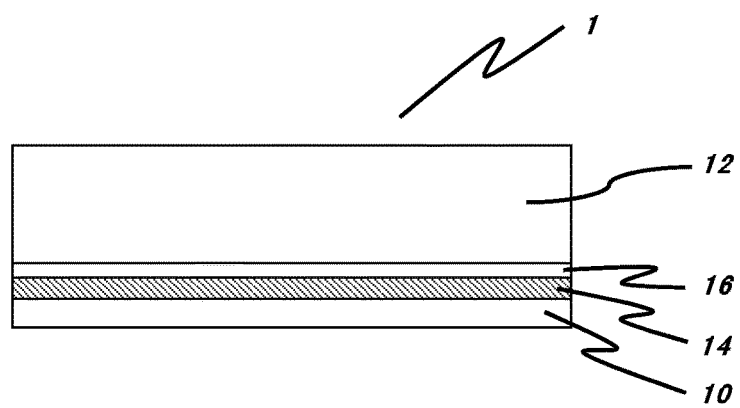
FIG. 2 is a schematic explanatory view of a laminate including a first acrylic resin layer, a thermoplastic resin layer, a third acrylic resin layer, and a second acrylic resin layer.

A schematic explanatory view of a laminate that can be manufactured by the injection molding is illustrated in FIG. 2. In the present invention, the configuration of the laminate (for example, a ratio of the thickness of each layer) is not limited to the aspect illustrated in FIG. 2.

An example of another aspect of the manufacturing method of a laminate can include a manufacturing method by extrusion molding in which a melt of a resin composition is discharged from a die. When the laminate is manufactured by this method, the third acrylic resin layer may not be provided.

Examples of the manufacturing method of a laminate by extrusion molding through discharge from a die can include a method including the following steps:

a step of discharging, from a die, a molten resin laminate containing at least a melt of a resin composition (1) containing the (meth)acrylic resin, a melt of a resin composition containing the thermoplastic resin, and a melt of a resin composition (2) containing the (meth)acrylic resin; and a step of cooling the discharged molten resin laminate to obtain a laminate.

Here, the first acrylic resin layer is formed of a resin composition (1) containing a (meth)acrylic resin, the thermoplastic resin layer is formed of a resin composition containing a thermoplastic resin, and the second acrylic resin layer is formed of a resin composition (2) containing a (meth)acrylic resin. A laminate including a first acrylic resin layer, a thermoplastic resin layer, and a second acrylic resin layer in this order can be manufactured by these steps.

A discharge temperature of each of the resin composition (1) containing the (meth)acrylic resin and forming the first acrylic resin layer and the resin composition (2) containing the (meth)acrylic resin and forming the second acrylic resin layer can be appropriately selected according to a resin composition, a size of a laminate to be molded, and the like. The discharge temperature may be, for example, 180 to 300° C., more preferably 200 to 290° C., and still more preferably 220 to 280° C. The discharge temperature means a temperature of the melt of the resin composition at a discharge port (or immediately after discharge) of the die.

The melt of the resin composition containing the thermoplastic resin can be discharged from the die in a heated state, if necessary. The discharge temperature may be, for example, 130 to 250° C., more preferably 140 to 230° C., and still more preferably 150 to 200° C.

As a method of discharging, from the die, the molten resin laminate containing at least the melt of the resin composition (1) containing the (meth)acrylic resin, the melt of the resin composition containing the thermoplastic resin, and the melt of the resin composition (2) containing the (meth)acrylic resin, for example, the melt of the resin composition (1), the melt of the resin composition containing the thermoplastic resin, and the melt of the resin composition (2) are each supplied to a three-type three-layer distribution feed block and distributed to have a three-layer structure, and then, the molten resin laminate formed of the melt of the resin composition (1), the melt of the resin composition containing the thermoplastic resin, and the melt of the resin composition (2) containing the (meth)acrylic resin is discharged from a die lip of a multi-manifold die. The discharged molten laminate is cooled by being interposed between a first cooling roll and a second cooling roll and further between the second cooling roll and a third cooling roll, if necessary.

In the laminate that can be manufactured by the extrusion molding, a thickness of first acrylic resin layer is preferably 0.1 mm or more and 1.0 mm or less and more preferably 0.2 mm or more and 0.5 mm or less. A thickness of the thermoplastic resin layer is preferably 0.05 mm or more and 2.5 mm or less and more preferably 0.1 mm or more and 2.0 mm or less. A thickness of the second acrylic resin layer is preferably 0.1 mm or more and 30 mm or less and more preferably 0.5 mm or more and 10 mm or less.

A schematic explanatory view of a laminate that can be manufactured by the extrusion molding is illustrated in FIG. 1. In the present invention, the configuration of the laminate (for example, a ratio of the thickness of each layer) is not limited to the aspect illustrated in FIG. 1.

The laminate can be processed into a desired shape depending on the use thereof. The laminate is useful as, for example, an electron optical material (a material such as a front plate, for example, a display, a cover material, or a light guide plate), a vehicle material (an exterior material such as a glazing, a lamp cover, or an emblem, and an interior material such as a meter panel cover), a building material (a resin glazing material), and materials of various resin base materials.

EXAMPLES

Hereinafter, the present invention will be described in more detail with reference to Examples, but the present invention is not limited thereto. In Examples, "part(s)" and "%" are on a mass basis unless otherwise specified.

The contents of the respective notations of the first acrylic resin layer and the third acrylic resin layer in the following tables used in the following Examples and Comparative Examples are as follows.

S000: manufactured by Sumitomo Chemical Co., Ltd., trade name: TECHNOLLOY 5000, a methacrylic resin film formed of a methacrylic copolymer containing 100% by mass of a structural unit derived from alkyl methacrylate having an alkyl group having 1 to 4 carbon atoms The contents of the respective notations of the thermoplastic resin layers in the following tables used in the following Examples and Comparative Examples are as follows.

1185N: manufactured by DIC Covestro Polymer Ltd., PANDEX T-1185N (polyurethane resin, 78% of a component having $T_2^H$ of 0.03 ms or longer)

8185N: manufactured by DIC Covestro Polymer Ltd., PANDEX T-8185N (polyurethane resin, 78% of a component having $T_2^H$ of 0.03 ms or longer)

8180N: manufactured by DIC Covestro Polymer Ltd., PANDEX T-8180N (polyurethane resin, 91% of a component having $T_2^H$ of 0.03 ms or longer)

1180A: manufactured by BASF SE, Elastollan 1180A10 Clear (polyurethane resin, 90% of a component having $T_2^H$ of 0.03 ms or longer)

NY80A: manufactured by BASF SE, Elastollan NY80A10 Clear (polyurethane resin, 84% of a component having $T_2^H$ of 0.03 ms or longer)

KA-30: manufactured by Sumitomo Chemical Co., Ltd., SUMITATE KA-30 (ethylene-vinyl acetate copolymer resin, 28% by mass of vinyl acetate contained in the resin, 83% of a component having $T_2^H$ of 0.03 ms or longer)

WK307: manufactured by Sumitomo Chemical Co., Ltd., ACRYFT WK307 (ethylene-methacrylic acid ester copolymer resin, 25% by mass of methacrylic acid contained in the resin, 84% of a component having $T_2^H$ of 0.03 ms or longer)

XUSL451: manufactured by Sheedom Co., Ltd., Higress XUSL451 (polyurethane resin, 60% of a component having $T2^H$ of 0.03 ms or longer)

XUSL2086: manufactured by Sheedom Co., Ltd., Higress XUSL451 (polyurethane resin, 60% of a component having $T_2^H$ of 0.03 ms or longer)

NY998: manufactured by BASF SE, Elastollan NY998 (polyurethane resin, 53% of a component having $T_2^H$ of 0.03 ms or longer)

NY585: manufactured by BASF SE, Elastollan NY585 (polyurethane resin, 69% of a component having $T_2^H$ of 0.03 ms or longer)

L785A: manufactured by BASF SE, Elastollan L785A10 (polyurethane resin, 41% of a component having $T_2^H$ of 0.03 ms or longer)

Production Example 1 Production of Methacrylic Resin

To a polymerization reactor equipped with a stirrer, a mixture of 97.5 parts by mass of methyl methacrylate and 2.5 parts by mass of methyl acrylate, 0.016 parts by mass of 1,1-di(tert-butylperoxy)cyclohexane, and 0.16 parts by mass of n-octyl mercaptan were continuously fed, and a polymerization reaction was performed at 175° C. for 43 minutes of an average retention time. Next, a reaction solution (partial polymer) discharged from the polymerization reactor was preheated and then fed to a devolatilization extruder, and an unreacted monomer component was vaporized and recovered, thereby obtaining a pellet-like methacrylic resin A. In the obtained methacrylic resin A, a content of a monomer unit derived from the methyl methacrylate was 97.5% by mass, a content of a monomer unit derived from the methyl acrylate was 2.5% by mass, and an MFR was 2 g/10 min.

Production Example 2 Production of Two-Layer Sheet of Polycarbonate Resin and Methacrylic Resin A polycarbonate resin (manufactured by Sumika Polycarbonate Limited, Calibre 301-10) was melt-kneaded using a single-screw extruder with 40 mmφ, and the methacrylic resin of Production Example 1 was melt-kneaded using a single-screw extruder with 20 mmφ. Both the melts were formed into two layers so that one surface layer was formed of an acrylic resin via a feed block, extrusion was performed by a T-shaped die, and then cooling was performed so that both surfaces were completely in contact with a polishing roll, thereby obtaining a two-layer resin sheet in which a methacrylic resin layer was laminated on one surface of a polycarbonate resin substrate. A total thickness of the resin sheet was 0.8 mm, and a thickness of the methacrylic resin layer was 70 μm.

Example 1 Manufacturing of Laminate

Manufacturing of Laminate for an Injection Molding Including First Acrylic Resin Layer, Thermoplastic Resin Layer, and Third Acrylic Resin Layer 1185N as a thermoplastic resin was placed in a frame mold having a thickness of 1 mm, and preheating was performed at a temperature of 180° C. for 5 minutes. Next, pressing was performed at a pressure of 2 MPa for 3 minutes, and pressing was further performed at a pressure of 12 MPa for 1 minute, thereby molding a thermoplastic resin layer. Thereafter, pressing was performed at room temperature for cooling at a pressure of 2 MPa for 1 minute to obtain a sheet-shaped thermoplastic resin layer.

The sheet-shaped thermoplastic resin layer obtained as described above was interposed between a methacrylic resin film (manufactured by Sumitomo Chemical Co., Ltd., trade name: TECHNOLLOY 5000, a methacrylic copolymer containing 100% by mass of a structural unit derived from alkyl methacrylate having an alkyl group having 1 to 4 carbon atoms, constituting the first acrylic resin layer) having a thickness of 0.3 mm and a methacrylic resin film (manufactured by Sumitomo Chemical Co., Ltd., trade name: TECHNOLLOY S000, a resin composition is the same as described above, constituting the third acrylic resin layer) having a thickness of 0.1 mm.

Preheating was performed at a temperature of 145° C. for 30 seconds, pressing was performed at a pressure of 1 MPa for 30 seconds, pressing was performed at a pressure of 2 MPa for 1 minute, and then, pressing was performed at a pressure of 12 MPa for 1 minute to perform molding.

Thereafter, pressing was performed at room temperature for cooling at a pressure of 2 MPa for 1 minute to obtain a laminate for an injection molding.

In the obtained laminate for an injection molding, a thickness of the first acrylic resin layer was 0.3 mm, a thickness of the thermoplastic resin layer was 0.6 mm, and a thickness of the third acrylic resin layer was 0.1 mm.

Manufacturing of Laminate

The laminate for an injection molding obtained as described above was cut into a rectangle of 105 mm×95 mm. A surface of the first acrylic resin layer of the obtained sample was attached to a mold having a thickness of 120 mm×100 mm×3 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the laminate for an injection molding at a cylinder temperature of 250° C. to obtain a laminate including a first acrylic resin layer, a thermoplastic resin layer, a third acrylic resin layer, and a second acrylic resin layer and having a total thickness of 3 mm.

Measurement of a spin-spin relaxation time $T_2^H$ in pulse NMR measurement of the thermoplastic resin layer was performed according to the following procedure.

<Measurement of Pulse NMR of Hydrogen 1>

A relaxation time $T_2^H$ and a component fraction $R_n$ were calculated by fitting according to Equation (F1), with respect to a signal intensity $I(\tau)$ obtained using a pulse NMR apparatus. The pulse NMR measurement is performed using the Solid Echo method, and the measurement conditions are as follows. As the sample, a sheet-shaped thermoplastic resin was used.

Measurement apparatus: minispec mq20 (manufactured by Bruker Corporation)
Nuclide: Hydrogen 1 (20 MHz)
Magnetostatic field intensity: 0.47 tesla
Repetition time: 3 seconds
Integration times: 128 times
Temperature: 23.5° C.

Example 2

A laminate was prepared in the same manner as that of Example 1 except that the laminate for an injection molding obtained in Example 1 was attached to a mold of 120 mm×100 mm×5 mm and a laminate having a total thickness of 5 mm was obtained. The thicknesses of the respective layers are shown in the following table.

Example 3

1185N as a thermoplastic resin was placed in a frame mold having a thickness of 2 mm, and preheating was performed at a temperature of 180° C. for 5 minutes. Next, pressing was performed at a pressure of 2 MPa for 3 minutes, and pressing was further performed at a pressure of 12 MPa for 1 minute, thereby molding a thermoplastic resin layer. Thereafter, pressing was performed at room temperature for cooling at a pressure of 2 MPa for 1 minute to obtain a sheet-shaped thermoplastic resin layer.

The sheet-shaped thermoplastic resin layer obtained as described above was interposed between a methacrylic resin film (manufactured by Sumitomo Chemical Co., Ltd., trade name: TECHNOLLOY 5000, a methacrylic copolymer containing 100% by mass of a structural unit derived from alkyl methacrylate having an alkyl group having 1 to 4 carbon atoms, constituting the first acrylic resin layer) having a thickness of 0.3 mm and a methacrylic resin film (manufactured by Sumitomo Chemical Co., Ltd., trade name: TECHNOLLOY S000, a resin composition is the same as described above, constituting the third acrylic resin layer) having a thickness of 0.1 mm.

Preheating was performed at a temperature of 145° C. for 30 seconds, pressing was performed at a pressure of 1 MPa for 30 seconds, pressing was performed at a pressure of 2 MPa for 1 minute, and then, pressing was performed at a pressure of 12 MPa for 1 minute to perform molding.

Thereafter, pressing was performed at room temperature for cooling at a pressure of 2 MPa for 1 minute to obtain a laminate for an injection molding.

The laminate for an injection molding obtained as described above was cut into a rectangle of 105 mm×95 mm. A surface of the first acrylic resin layer of the obtained sample was attached to a mold having a thickness of 120 mm×100 mm×4 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the laminate for an injection molding at a cylinder temperature of 250° C. to obtain a laminate including a first acrylic resin layer, a thermoplastic resin layer, a third acrylic resin layer, and a second acrylic resin layer and having a total thickness of 4 mm. The thicknesses of the respective layers are shown in the following table.

Example 4

A laminate was prepared in the same manner as that of Example 3 except that a laminate having a total thickness of 5 mm was obtained. The thicknesses of the respective layers are shown in the following table.

Example 5

A laminate was prepared in the same manner as that of Example 1 except that 8185N was used instead of 1185N. The thicknesses of the respective layers are shown in the following table.

Example 6

A laminate was prepared in the same manner as that of Example 5 except that the laminate for an injection molding obtained in Example 5 was attached to a mold of 120 mm×100 mm×5 mm and a laminate having a total thickness of 5 mm was obtained. The thicknesses of the respective layers are shown in the following table.

Example 7

A laminate for an injection molding was obtained by the same procedure as that of Example 3 except that 8185N was used as the thermoplastic resin and the thickness of the thermoplastic resin layer was adjusted to 1.4 mm.

A laminate having a total thickness of 4 mm was obtained by the same procedure as that of Example 3 using the obtained laminate for an injection molding. The thicknesses of the respective layers are shown in the following table.

Example 8

A laminate was prepared in the same manner as that of Example 7 except that the laminate for an injection molding obtained in Example 7 was attached to a mold of 120 mm×100 mm×5 mm and a laminate having a total thickness of 5 mm was obtained. The thicknesses of the respective layers are shown in the following table.

Example 9

KA-30 as a thermoplastic resin was placed in a frame mold having a thickness of 1 mm, and preheating was performed at a temperature of 150° C. for 5 minutes. Next, pressing was performed at a pressure of 2 MPa for 3 minutes, and pressing was further performed at a pressure of 12 MPa for 1 minute, thereby molding a thermoplastic resin layer. Thereafter, pressing was performed at room temperature at a pressure of 2 MPa for 1 minute for cooling to obtain a sheet-shaped thermoplastic resin layer.

The sheet-shaped thermoplastic resin layer obtained as described above was interposed between a methacrylic resin film (manufactured by Sumitomo Chemical Co., Ltd., trade name: TECHNOLLOY S000, a methacrylic copolymer containing 100% by mass of a structural unit derived from alkyl methacrylate having an alkyl group having 1 to 4 carbon atoms, constituting the first acrylic resin layer) having a thickness of 0.3 mm and a methacrylic resin film (manufactured by Sumitomo Chemical Co., Ltd., trade name: TECHNOLLOY S000, a resin composition is the same as described above, constituting the third acrylic resin layer) having a thickness of 0.1 mm.

Preheating was performed at a temperature of 120° C. for 30 seconds, pressing was performed at a pressure of 1 MPa for 30 seconds, pressing was performed at a pressure of 2 MPa for 1 minute, and then, pressing was performed at a pressure of 12 MPa for 1 minute to perform molding.

Thereafter, pressing was performed at room temperature for cooling at a pressure of 2 MPa for 1 minute to obtain a laminate for an injection molding.

The laminate for an injection molding obtained as described above was cut into a rectangle of 105 mm×95 mm. A surface of the first acrylic resin layer of the obtained sample was attached to a mold having a thickness of 120 mm×100 mm×3 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the laminate for an injection molding at a cylinder temperature of 250° C. to obtain a laminate including a first acrylic resin layer, a thermoplastic resin layer, a third acrylic resin layer, and a second acrylic resin layer and having a total thickness of 3 mm. The thicknesses of the respective layers are shown in the following table.

Example 10

A laminate was prepared in the same manner as that of Example 9 except that the laminate for an injection molding obtained in Example 9 was attached to a mold of 120 mm×100 mm×4 mm and a laminate having a total thickness of 4 mm was obtained. The thicknesses of the respective layers are shown in the following table.

Example 11

A laminate was prepared in the same manner as that of Example 9 except that the laminate for an injection molding obtained in Example 9 was attached to a mold of 120 mm×100 mm×5 mm and a laminate having a total thickness of 5 mm was obtained. The thicknesses of the respective layers are shown in the following table.

Example 12

A laminate having a total thickness of 3 mm was obtained in the same manner as that of Example 9 except that WK307 was used as the thermoplastic resin. The thicknesses of the respective layers are shown in the following table.

Example 13

A laminate was prepared in the same manner as that of Example 12 except that the laminate for an injection molding obtained in Example 12 was attached to a mold of 120 mm×100 mm×4 mm and a laminate having a total thickness of 4 mm was obtained. The thicknesses of the respective layers are shown in the following table.

Example 14

A laminate was prepared in the same manner as that of Example 12 except that the laminate for an injection molding obtained in Example 12 was attached to a mold of 120 mm×100 mm×5 mm and a laminate having a total thickness of 5 mm was obtained. The thicknesses of the respective layers are shown in the following table.

Example 15

A laminate was prepared in the same manner as that of Example 1 except that 1180A was used instead of 1185N. The thicknesses of the respective layers are shown in the following table.

Example 16

A laminate was prepared in the same manner as that of Example 15 except that a laminate having a total thickness of 4 mm was obtained. The thicknesses of the respective layers are shown in the following table.

Example 17

A laminate was prepared in the same manner as that of Example 1 except that NY80A was used instead of 1185N. The thicknesses of the respective layers are shown in the following table.

Example 18

A laminate was prepared in the same manner as that of Example 17 except that a laminate having a total thickness of 4 mm was obtained. The thicknesses of the respective layers are shown in the following table.

Example 19

A laminate was prepared in the same manner as that of Example 17 except that a laminate having a total thickness of 5 mm was obtained. The thicknesses of the respective layers are shown in the following table.

Example 20

A laminate was prepared in the same manner as that of Example 5 except that 8180N was used instead of 8185N. The thicknesses of the respective layers are shown in the following table.

Example 21

A laminate was prepared in the same manner as that of Example 20 except that a laminate having a total thickness of 5 mm was obtained. The thicknesses of the respective layers are shown in the following table.

Production Example 3 Production of Two-Type Three-Layer Sheet of Methacrylic Resin and Polyurethane Resin (1180A)

A polyurethane resin (1180A) was melt-kneaded at 190° C. using a single-screw extruder having a screw diameter of 40 mm, and a methacrylic resin (manufactured by Sumitomo Chemical Co., Ltd., SUMIPEX EX) was melt-kneaded at 250° C. using a single-screw extruder having a screw diameter of 25 mm. Both the melts were formed into three layers so that both surface layers were formed of a methacrylic resin via a T die set at 210° C., extrusion was performed, and then cooling was performed so that both surfaces were completely in contact with a polishing roll, thereby obtaining a two-type three-layer resin sheet in which a methacrylic resin layer was laminated on each of both surfaces of a polyurethane resin. A total thickness of the resin sheet was 1.5 mm, a thickness of the thermoplastic resin layer was 0.9 mm, and a thickness of each of the first acrylic resin layer and the second acrylic resin layer was 0.3 mm.

Production Example 4 Production of Two-Type Three-Layer Sheet of Methacrylic Resin and Polyurethane Resin (NY80A)

A polyurethane resin (NY80A) was melt-kneaded at 190° C. using a single-screw extruder having a screw diameter of 40 mm, and a methacrylic resin (manufactured by Sumitomo Chemical Co., Ltd., SUMIPEX EX) was melt-kneaded at 250° C. using a single-screw extruder having a screw diameter of 20 mm. Both the melts were formed into three layers so that both surface layers were formed of a methacrylic resin via a T die set at 210° C., extrusion was performed, and then cooling was performed so that both surfaces were completely in contact with a polishing roll, thereby obtaining a two-type three-layer resin sheet in which a methacrylic resin layer was laminated on each of both surfaces of a polyurethane resin. A total thickness of the resin sheet was 1.4 mm, a thickness of the thermoplastic resin layer was 1.0 mm, and a thickness of each of the first acrylic resin layer and the second acrylic resin layer was 0.2 mm.

Example 22

The two-type three-layer sheet obtained in Production Example 3 was cut into a rectangle of 105 mm×95 mm. A surface of the first acrylic resin layer of the obtained sample was attached to a mold having a thickness of 120 mm×100 mm×3 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the two-type three-layer sheet at a cylinder temperature of 250° C. to obtain a laminate including a first acrylic resin layer, a thermoplastic resin layer, a third acrylic resin layer, and a second acrylic resin layer and having a total thickness of 3 mm. The thicknesses of the respective layers are shown in the following table.

Example 23

A laminate was prepared in the same manner as that of Example 22 except that a laminate having a total thickness of 4 mm was obtained. The thicknesses of the respective layers are shown in the following table.

Example 24

A laminate was prepared in the same manner as that of Example 22 except that a laminate having a total thickness of 5 mm was obtained. The thicknesses of the respective layers are shown in the following table.

Example 25

A laminate was prepared in the same manner as that of Example 22 except that the two-type three-layer sheet obtained in Production Example 4 was used instead of the two-type three-layer sheet obtained in Production Example 3. The thicknesses of the respective layers are shown in the following table.

Example 26

A laminate was prepared in the same manner as that of Example 25 except that a laminate having a total thickness of 4 mm was obtained. The thicknesses of the respective layers are shown in the following table.

Example 27

A laminate was prepared in the same manner as that of Example 25 except that a laminate having a total thickness of 4 mm was obtained. The thicknesses of the respective layers are shown in the following table.

Example 28

A polyurethane resin (NY80A) was melt-kneaded at 170° C. using a single-screw extruder having a screw diameter of 40 mm, and a methacrylic resin (manufactured by Sumitomo Chemical Co., Ltd., SUMIPEX MH5) was melt-kneaded at 230° C. using a single-screw extruder having a screw diameter of 25 mm. Both the melts were formed into three layers so that both surface layers were formed of a methacrylic resin via a T die set at 210° C., extrusion was performed, and then cooling was performed so that both surfaces were completely in contact with a polishing roll, thereby obtaining a two-type three-layer resin sheet in which a methacrylic resin layer was laminated on each of both surfaces of a polyurethane resin. A total thickness of the resin sheet was 2.8 mm, a thickness of the thermoplastic resin layer was 0.9 mm, a thickness of the first acrylic resin was 0.3 mm, and a thickness of the second acrylic resin layer was 1.6 mm.

Comparative Example 1

The methacrylic resin obtained in Production Example 1 was injection-molded in a mold of 120 mm×100 mm×3 mm at a cylinder temperature of 250° C., thereby preparing a single layered body having a thickness of 3 mm.

Comparative Example 2

A single layered body was prepared in the same manner as that of Comparative Example 1 except that a single layered body having a thickness of 4 mm was obtained.

Comparative Example 3

A single layered body was prepared in the same manner as that of Comparative Example 1 except that a single layered body having a thickness of 5 mm was obtained.

Comparative Example 4

The sheet-shaped polyurethane (manufactured by Sheedom Co., Ltd., XUSL451) having a thickness of 0.625 mm was interposed between a methacrylic resin film (manufactured by Sumitomo Chemical Co., Ltd., trade name: TECHNOLLOY S000, a methacrylic copolymer containing 100% by mass of a structural unit derived from alkyl methacrylate having an alkyl group having 1 to 4 carbon atoms, constituting the first acrylic resin layer) having a thickness of 0.3 mm and a methacrylic resin film (manufactured by Sumitomo Chemical Co., Ltd., trade name: TECHNOLLOY S000, a resin composition is the same as described above, constituting the third acrylic resin layer) having a thickness of 0.1 mm.

Preheating was performed at a temperature of 120° C. for 30 seconds, pressing was performed at a pressure of 1 MPa for 30 seconds, pressing was performed at a pressure of 2 MPa for 1 minute, and then, pressing was performed at a pressure of 12 MPa for 1 minute to perform molding.

Thereafter, pressing was performed at room temperature for cooling at a pressure of 2 MPa for 1 minute to obtain a laminate for an injection molding. The thicknesses of the respective layers are shown in the following table.

The laminate for an injection molding obtained as described above was cut into a rectangle of 105 mm×95 mm. A surface of the first acrylic resin layer of the obtained sample was attached to a mold having a thickness of 120 mm×100 mm×3 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the laminate for an injection molding at a cylinder temperature of 250° C. to obtain a laminate including a first acrylic resin layer, a thermoplastic resin layer, a third acrylic resin layer, and a second acrylic resin layer and having a total thickness of 3 mm.

Comparative Example 5

A laminate having a total thickness of 3 mm was prepared in the same manner as that of Comparative Example 4 except that polyurethane (manufactured by Sheedom Co., Ltd., XUSL2086) having a thickness of 0.4 mm was used as the thermoplastic resin. The thicknesses of the respective layers are shown in the following table.

Comparative Example 6

NY998 as a thermoplastic resin was placed in a frame mold having a thickness of 1 mm, and preheating was performed at a temperature of 180° C. for 5 minutes. Next, pressing was performed at a pressure of 2 MPa for 3 minutes, and pressing was further performed at a pressure of 12 MPa for 1 minute, thereby molding a thermoplastic resin layer. Thereafter, pressing was performed at room temperature for cooling at a pressure of 2 MPa for 1 minute to obtain a sheet-shaped thermoplastic resin layer.

The sheet-shaped thermoplastic resin layer obtained as described above was interposed between a methacrylic resin film (manufactured by Sumitomo Chemical Co., Ltd., trade name: TECHNOLLOY S000, a methacrylic copolymer containing 100% by mass of a structural unit derived from alkyl methacrylate having an alkyl group having 1 to 4 carbon atoms, constituting the first acrylic resin layer) having a thickness of 0.3 mm and a methacrylic resin film (manufactured by Sumitomo Chemical Co., Ltd., trade name: TECHNOLLOY S000, a resin composition is the same as described above, constituting the third acrylic resin layer) having a thickness of 0.1 mm.

Preheating was performed at a temperature of 145° C. for 30 seconds, pressing was performed at a pressure of 1 MPa for 30 seconds, pressing was performed at a pressure of 2 MPa for 1 minute, and then, pressing was performed at a pressure of 12 MPa for 1 minute to perform molding.

Thereafter, pressing was performed at room temperature for cooling at a pressure of 2 MPa for 1 minute to obtain a laminate for an injection molding.

The laminate for an injection molding obtained as described above was cut into a rectangle of 105 mm×95 mm. A surface of the first acrylic resin layer of the obtained sample was attached to a mold having a thickness of 120 mm×100 mm×3 mm with a double-sided tape.

A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the third acrylic resin layer of the laminate for an injection molding at a cylinder temperature of 250° C. to obtain a laminate including a first acrylic resin layer, a thermoplastic resin layer, a third acrylic resin layer, and a second acrylic resin layer and having a total thickness of 3 mm. The thicknesses of the respective layers are shown in the following table.

Comparative Example 7

A laminate was prepared in the same manner as that of Comparative Example 6 except that the laminate for an injection molding obtained in Comparative Example 6 was attached to a mold of 120 mm×100 mm×4 mm and a laminate having a total thickness of 4 mm was obtained. The thicknesses of the respective layers are shown in the following table.

Comparative Example 8

A laminate was prepared in the same manner as that of Comparative Example 6 except that the laminate for an injection molding obtained in Comparative Example 6 was attached to a mold of 120 mm×100 mm×5 mm and a laminate having a total thickness of 5 mm was obtained. The thicknesses of the respective layers are shown in the following table.

Comparative Example 9

A laminate was obtained in the same manner as that of Comparative Example 6 except that NY585 was used as the thermoplastic resin. The thicknesses of the respective layers are shown in the following table.

Comparative Example 10

A laminate was prepared in the same manner as that of Comparative Example 9 except that the laminate for an injection molding obtained in Comparative Example 9 was attached to a mold of 120 mm×100 mm×4 mm and a laminate having a total thickness of 4 mm was obtained. The thicknesses of the respective layers are shown in the following table.

Comparative Example 11

A laminate was prepared in the same manner as that of Comparative Example 9 except that the laminate for an injection molding obtained in Comparative Example 9 was attached to a mold of 120 mm×100 mm×5 mm and a laminate having a total thickness of 5 mm was obtained. The thicknesses of the respective layers are shown in the following table.

Comparative Example 12

The resin sheet obtained in Production Example 2 was cut into a rectangle of 105 mm×95 mm. A surface of the methacrylic resin layer of the obtained sample was attached to a mold having a thickness of 120 mm×100 mm×4 mm with a double-sided tape.
A resin composition (2) containing the methacrylic resin (a methacrylic copolymer containing 100% by mass of a structural unit derived from alkyl methacrylate having an alkyl group having 1 to 4 carbon atoms) obtained in Production Example 1 was injection-molded on the polycarbonate resin layer of the resin sheet at a cylinder temperature of 250° C. to obtain a laminate including a first acrylic resin layer, a polycarbonate resin layer, and a second acrylic resin layer and having a total thickness of 4 mm. The thicknesses of the respective layers are shown in the following table.

Comparative Example 13

A laminate was prepared in the same manner as that of Comparative Example 12 except that the resin sheet obtained in Production Example 2 was attached to a mold of 120 mm×100 mm×5 mm and a laminate having a total thickness of 5 mm was obtained. The thicknesses of the respective layers are shown in the following table.

Comparative Example 14

A laminate was prepared in the same manner as that of Example 5 except that L785A was used instead of 8185N. The thicknesses of the respective layers are shown in the following table.

Comparative Example 15

A laminate was prepared in the same manner as that of Comparative Example 14 except that a laminate having a total thickness of 4 mm was obtained. The thicknesses of the respective layers are shown in the following table.

Comparative Example 16

A laminate was prepared in the same manner as that of Comparative Example 14 except that a laminate having a total thickness of 5 mm was obtained. The thicknesses of the respective layers are shown in the following table.

Samples for pulse NMR evaluation were prepared according to the following procedure, and the following samples were evaluated by the same procedure as described above.

Methacrylic Resin Obtained in Production Example 1 (0% of Component Having $T_2^H$ of 0.03 ms or Longer)

Preheating was performed at a temperature of 220° C. for 5 minutes in a frame mold having a thickness of 1 mm. Next, pressing was performed at a pressure of 2 MPa for 3 minutes, pressing was further performed at a pressure of 12 MPa for 1 minute, and then, pressing was performed at room temperature for cooling at a pressure of 2 MPa for 1 minute, thereby obtaining a sheet-shaped sample.

Polycarbonate Resin (Manufactured by Sumika Polycarbonate Limited, Calibre 301-10, 0% of Component Having $T_2^H$ of 0.03 ms or Longer)

Preheating was performed at a temperature of 280° C. for 5 minutes in a frame mold having a thickness of 1 mm. Next, pressing was performed at a pressure of 2 MPa for 3 minutes, pressing was further performed at a pressure of 12 MPa for 1 minute, and then, pressing was performed at room temperature for cooling at a pressure of 2 MPa for 1 minute, thereby obtaining a sheet-shaped sample.

The following evaluation was performed using the laminate obtained in each of Examples and Comparative Examples. The evaluation results are shown in the following table.

Impact Resistance Evaluation (−30° C.)

The laminate obtained in each of Examples and Comparative Examples was cut into a size of 10 cm×10 cm to prepare a plate-shaped test piece.
The test piece was fixed by being interposed between pressing plates so that the central portion of the prepared test piece was positioned at the center of a hole having a diameter of 3 cm with respect to a test piece support stand having a hole having a diameter of 3 cm.
The fixed test piece was allowed to stand under a condition of a temperature of −30° C. for 3 hours. Thereafter, a punching speed of 5 m/sec was selected as a reference speed, an impact was applied to the central portion of the second acrylic resin layer of the test piece according to ASTM-D3763 using a striker having a hemispherical tip with a diameter of ½ inches.
The state of the test piece after the impact test was visually evaluated based on the following criteria.
◯: Although the impact site was cracked, the striker was not penetrated, and no hole was made in the impact surface.
x: The impact site was cracked, the striker was penetrated, and a hole was formed in the impact surface.

TABLE 1

| | Example 1 | Example 2 | Example 3 | Example 4 | Example 5 | Example 6 | Example 7 | Example 8 | Example 9 |
|---|---|---|---|---|---|---|---|---|---|
| First Acrylic Resin Layer | S000 | S000 | S000 | S000 | S000 | S000 | S000 | S000 | S000 |
| Thickness of first acrylic resin layer (mm) | 0.3 | 0.3 | 0.3 | 0.3 | 0.3 | 0.3 | 0.3 | 0.3 | 0.3 |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| Thermoplastic Resin Layer | 1185N | 1185N | 1185N | 1185N | 8185N | 8185N | 8185N | 8185N | KA-30 |
| Thickness of thermoplastic resin layer (mm) | 0.6 | 0.6 | 1.6 | 1.6 | 0.6 | 0.6 | 1.4 | 1.4 | 0.7 |
| % of component having $T_2^H$ of 0.03 ms or longer in thermoplastic resin layer | 78 | 78 | 78 | 78 | 78 | 78 | 78 | 78 | 83 |
| Third Acrylic Resin Layer | S000 | S000 | S000 | S000 | S000 | S000 | S000 | S000 | S000 |
| Thickness of third acrylic resin layer (mm) | 0.1 | 0.1 | 0.1 | 0.1 | 0.1 | 0.1 | 0.1 | 0.1 | 0.1 |
| Second Acrylic Resin Layer | Production Example 1 | Production Example 1 | Production Example 1 | Production Example 1 | Production Example 1 | Production Example 1 | Production Example 1 | Production Example 1 | Production Example 1 |
| Thickness of second acrylic resin layer (mm) | 2 | 4 | 2 | 3 | 2 | 4 | 2.2 | 3.2 | 1.9 |
| T1:(T2 + T3) | 1:7.0 | 1:13.7 | 1:7.0 | 1:10.3 | 1:7.0 | 1:13.7 | 1:7.7 | 1:11.0 | 1:6.7 |
| Impact Resistance Evaluation (−30° C.) | ○ | ○ | ○ | ○ | ○ | ○ | ○ | ○ | ○ |

TABLE 2

|  | Example 10 | Example 11 | Example 12 | Example 13 | Example 14 | Comparative Example 1 | Comparative Example 2 | Comparative Example 3 | Comparative Example 4 |
|---|---|---|---|---|---|---|---|---|---|
| First Acrylic Resin Layer | S000 | S000 | S000 | S000 | S000 | — | — | — | S000 |
| Thickness of first acrylic resin layer (mm) | 0.3 | 0.3 | 0.3 | 0.3 | 0.3 | — | — | — | 0.3 |
| Thermoplastic Resin Layer | KA-30 | KA-30 | WK307 | WK307 | WK307 | — | — | — | XUSL451 |
| Thickness of thermoplastic resin layer (mm) | 0.7 | 0.7 | 0.7 | 0.7 | 0.7 | — | — | — | 0.3 |
| % of component having $T_2^H$ of 0.03 ms or longer in thermoplastic resin layer | 83 | 83 | 84 | 84 | 84 | 0 | 0 | 0 | 60 |
| Third Acrylic Resin Layer | S000 | S000 | S000 | S000 | S000 | — | — | — | S000 |
| Thickness of third acrylic resin layer (mm) | 0.1 | 0.1 | 0.1 | 0.1 | 0.1 | — | — | — | 0.1 |
| Second Acrylic Resin Layer | Production Example 1 | Production Example 1 | Production Example 1 | Production Example 1 | Production Example 1 | Production Example 1 | Production Example 1 | Production Example 1 | Production Example 1 |
| Thickness of second acrylic resin layer (mm) | 2.9 | 3.9 | 1.9 | 2.9 | 3.9 | 3 | 4 | 5 | 2.3 |
| T1:(T2 + T3) | 1:10.0 | 1:13.3 | 1:6.7 | 1:10.0 | 1:13.3 | — | — | — | 1:8.0 |
| Impact Resistance Evaluation (−30° C.) | ○ | ○ | ○ | ○ | ○ | X | X | X | X |

TABLE 3

|  | Comparative Example 5 | Comparative Example 6 | Comparative Example 7 | Comparative Example 8 | Comparative Example 9 | Comparative Example 10 | Comparative Example 11 | Comparative Example 12 | Comparative Example 13 |
|---|---|---|---|---|---|---|---|---|---|
| First Acrylic Resin Layer | S000 | S000 | S000 | S000 | S000 | S000 | S000 | — | — |
| Thickness of first acrylic resin layer (mm) | 0.3 | 0.3 | 0.3 | 0.3 | 0.3 | 0.3 | 0.3 | — | — |

TABLE 3-continued

|  | Comparative Example 5 | Comparative Example 6 | Comparative Example 7 | Comparative Example 8 | Comparative Example 9 | Comparative Example 10 | Comparative Example 11 | Comparative Example 12 | Comparative Example 13 |
|---|---|---|---|---|---|---|---|---|---|
| Thermoplastic Resin Layer | XUSL2086 | NY998 | NY998 | NY998 | NY585 | NY585 | NY585 | Production Example 2 | Production Example 2 |
| Thickness of thermoplastic resin layer (mm) | 0.3 | 0.7 | 0.7 | 0.7 | 0.7 | 0.7 | 0.7 | 0.73 | 0.73 |
| % of component having $T_2^H$ of 0.03 ms or longer in thermoplastic resin layer | 60 | 53 | 53 | 53 | 69 | 69 | 69 | 0 | 0 |
| Third Acrylic Resin Layer | S000 | S000 | S000 | S000 | S000 | S000 | S000 | Production Example 1 | Production Example 1 |
| Thickness of third acrylic resin layer (mm) | 0.1 | 0.1 | 0.1 | 0.1 | 0.1 | 0.1 | 0.1 | 0.08 | 0.08 |
| Second Acrylic Resin Layer | Production Example 1 | Production Example 1 | Production Example 1 | Production Example 1 | Production Example 1 | Production Example 1 | Production Example 1 | Production Example 1 | Production Example 1 |
| Thickness of second acrylic resin layer (mm) | 2.3 | 1.9 | 2.9 | 3.9 | 1.9 | 2.9 | 3.9 | 3.19 | 4.19 |
| T1:(T2 + T3) | 1:8.0 | 1:6.7 | 1:10.0 | 1:13.3 | 1:6.7 | 1:10.0 | 1:13.3 | — | — |
| Impact Resistance Evaluation (−30° C.) | X | X | X | X | X | X | X | X | X |

TABLE 4

|  | Example 15 | Example 16 | Example 17 | Example 18 | Example 19 | Example 20 | Example 21 |
|---|---|---|---|---|---|---|---|
| First Acrylic Resin Layer | S000 | S000 | S000 | S000 | S000 | S000 | S000 |
| Thickness of first acrylic resin layer (mm) | 0.3 | 0.3 | 0.3 | 0.3 | 0.3 | 0.3 | 0.3 |
| Thermoplastic Resin Layer | 1180A | 1180A | NY80A | NY80A | NY80A | 8180N | 8180N |
| Thickness of thermoplastic resin layer (mm) | 0.7 | 0.7 | 0.8 | 0.8 | 0.8 | 0.9 | 0.9 |
| % of component having $T_2^H$ of 0.03 ms or longer in thermoplastic resin layer | 90 | 90 | 84 | 84 | 84 | 91 | 91 |
| Third Acrylic Resin Layer | S000 | S000 | S000 | S000 | S000 | S000 | S000 |
| Thickness of third acrylic resin layer (mm) | 0.1 | 0.1 | 0.1 | 0.1 | 0.1 | 0.1 | 0.1 |
| Second Acrylic Resin Layer | Production Example 1 | Production Example 1 | Production Example 1 | Production Example 1 | Production Example 1 | Production Example 1 | Production Example 1 |
| Thickness of second acrylic resin layer (mm) | 1.9 | 2.9 | 1.8 | 2.8 | 3.8 | 2.7 | 3.7 |
| T1:(T2 + T3) | 1:6.7 | 1:10 | 1:6.3 | 1:9.7 | 1:13 | 1:9.3 | 1:12.7 |
| Impact Resistance Evaluation (−30° C.) | ○ | ○ | ○ | ○ | ○ | ○ | ○ |

|  | Comparative Example 14 | Comparative Example 15 | Comparative Example 16 |
|---|---|---|---|
| First Acrylic Resin Layer | S000 | S000 | S000 |
| Thickness of first acrylic resin layer (mm) | 0.3 | 0.3 | 0.3 |
| Thermoplastic Resin Layer | L785A | L785A | L785A |
| Thickness of thermoplastic resin layer (mm) | 0.7 | 0.7 | 0.7 |

TABLE 4-continued

|  |  |  |  |
|---|---|---|---|
| % of component having $T_2^H$ of 0.03 ms or longer in thermoplastic resin layer | 41 | 41 | 41 |
| Third Acrylic Resin Layer | S000 | S000 | S000 |
| Thickness of third acrylic resin layer (mm) | 0.1 | 0.1 | 0.1 |
| Second Acrylic Resin Layer | Production Example 1 | Production Example 1 | Production Example 1 |
| Thickness of second acrylic resin layer (mm) | 1.9 | 2.9 | 3.9 |
| T1:(T2 + T3) | 1:6.7 | 1:10 | 1:13.3 |
| Impact Resistance Evaluation (−30° C.) | X | X | X |

TABLE 5

|  | Example 22 | Example 23 | Example 24 | Example 25 | Example 26 | Example 27 | Example 28 |
|---|---|---|---|---|---|---|---|
| First Acrylic Resin Layer | EX | EX | EX | EX | EX | EX | MH5 |
| Thickness of first acrylic resin layer (mm) | 0.3 | 0.3 | 0.3 | 0.2 | 0.2 | 0.2 | 0.3 |
| Thermoplastic Resin Layer | 1180A | 1180A | 1180A | NY80A | NY80A | NY80A | NY80A |
| Thickness of thermoplastic resin layer (mm) | 0.9 | 0.9 | 0.9 | 1 | 1 | 1 | 0.9 |
| % of component having $T_2^H$ of 0.03 ms or longer in thermoplastic resin layer | 90 | 90 | 90 | 84 | 84 | 84 | 84 |
| Third Acrylic Resin Layer | EX | EX | EX | EX | EX | EX | — |
| Thickness of third acrylic resin layer (mm) | 0.3 | 0.3 | 0.3 | 0.2 | 0.2 | 0.2 | 0 |
| Second Acrylic Resin Layer | Production Example 1 | Production Example 1 | Production Example 1 | Production Example 1 | Production Example 1 | Production Example 1 | MH5 |
| Thickness of second acrylic resin layer (mm) | 1.5 | 2.5 | 3.5 | 1.6 | 2.6 | 3.6 | 1.6 |
| T1:(T2 + T3) | 1:6 | 1:9.3 | 1:12.7 | 1:9 | 1:14 | 1:19 | 1:5.3 |
| Impact Resistance Evaluation (−30° C.) | ○ | ○ | ○ | ○ | ○ | ○ | ○ |

It was confirmed that in all of the laminates obtained in Examples, the impact resistance was excellent even under low-temperature conditions.

In Comparative Examples 1 to 3, a single layered body including only a second acrylic resin layer was obtained. It was confirmed that in all of them, the impact resistance was poor.

Comparative Examples 4 to 11 and 14 to 16 are examples in which, although the laminate includes a thermoplastic resin layer, the percentage of the component contained in the thermoplastic resin layer and having a spin-spin relaxation time $T_2^H$ in pulse NMR measurement of 0.03 ms or longer is less than 71%. In all of these examples, it was confirmed that the impact resistance of the laminate was poor.

Comparative Examples 12 and 13 are examples in which two layers of a polycarbonate resin and a methacrylic resin are used instead of the thermoplastic resin layer. Also, in these examples, it was confirmed that the impact resistance was poor.

INDUSTRIAL APPLICABILITY

The resin laminate has an advantage that impact resistance, in particular, impact resistance under a low-temperature condition is excellent. The resin laminate can be preferably used as, for example, a resin glazing material.

DESCRIPTION OF REFERENCE SIGNS

1 Laminate
10 First Acrylic Resin Layer
12 Second Acrylic Resin Layer
14 Thermoplastic Resin Layer
16 Third Acrylic Resin Layer

The invention claimed is:

1. A laminate comprising a first acrylic resin layer, a thermoplastic resin layer, and a second acrylic resin layer in this order,
 wherein the thermoplastic resin layer contains 71% or more of a component having a spin-spin relaxation time $T_2^H$ in pulse N.M.R. measurement of 0.03 ms or longer, and wherein a thermoplastic resin constituting the thermoplastic layer consists of a polyurethane resin.

2. The laminate according to claim 1, wherein a thickness of the first acrylic resin layer is 0.1 mm or more and 1.0 mm or less,
 a thickness of the thermoplastic resin layer is 0.05 mm or more and 2.5 mm or less, and
 a thickness of the second acrylic resin layer is 0.1 mm or more and 30 mm or less.

3. The laminate according to claim 1, further comprising a third acrylic resin layer,
 wherein the third acrylic resin layer is provided between the second acrylic resin layer and the thermoplastic resin layer.

4. The laminate according to claim 2, wherein a ratio $[T_1:T_2]$ of a thickness $T_1$ of the first acrylic resin layer to a thickness $T_2$ of the second acrylic resin layer is within a range of $T_1:T_2=1:1.9$ to $1:29$.

5. The laminate according to claim 3, wherein a ratio $[T_1:(T_2+T_3)]$ of a thickness $T_1$ of the first acrylic resin layer to the sum of a thickness $T_2$ of the second acrylic resin layer and a thickness $T_3$ of the third acrylic resin layer is within a range of $T_1:(T_2+T_3)=1:2$ to $1:30$.

* * * * *